(12) United States Patent
Kajigaya et al.

(10) Patent No.: US 8,964,483 B2
(45) Date of Patent: Feb. 24, 2015

(54) SEMICONDUCTOR DEVICE AND MEMORY SYSTEM

(71) Applicant: PS4 Luxco S.a.r.l., Luxembourg (LU)

(72) Inventors: Kazuhiko Kajigaya, Tokyo (JP); Kazuo Ono, Tokyo (JP); Tomonori Sekiguchi, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 201 days.

(21) Appl. No.: 13/630,702

(22) Filed: Sep. 28, 2012

(65) Prior Publication Data

US 2013/0082404 A1 Apr. 4, 2013

(30) Foreign Application Priority Data

Sep. 30, 2011 (JP) ................................. 2011-217658

(51) Int. Cl.
*G11C 7/00* (2006.01)
*H01L 23/498* (2006.01)
*G11C 5/02* (2006.01)
*G11C 5/06* (2006.01)
(Continued)

(52) U.S. Cl.
CPC .............. *H01L 23/498* (2013.01); *G11C 5/025* (2013.01); *G11C 5/063* (2013.01); *G11C 7/1006* (2013.01); *G11C 11/4074* (2013.01); *G11C 11/4076* (2013.01); *G11C 11/4096* (2013.01); *G11C 5/02* (2013.01); *G11C 5/04* (2013.01); *G11C 5/14* (2013.01); *G11C 7/1012* (2013.01); *H01L 25/0657* (2013.01); *G11C 7/02* (2013.01); *H01L 25/18* (2013.01); *G11C 2207/107* (2013.01); *H01L 2225/06513* (2013.01); *H01L 2225/06541* (2013.01); *H01L 2924/0002* (2013.01)
USPC ........... 365/189.011; 365/189.03; 365/189.17

(58) Field of Classification Search
USPC .................... 365/189.011, 189.03, 189.17
See application file for complete search history.

(56) References Cited

U.S. PATENT DOCUMENTS 6,411,560 B1  6/2002 Tanizaki et al.
8,134,852 B2 * 3/2012 Kim et al. ....................... 365/51
(Continued)

FOREIGN PATENT DOCUMENTS

JP         2003-7059 A      1/2003
WO    WO 2009/079772 A1   7/2009

OTHER PUBLICATIONS

K. Ono et al., 1-Tbyte/s 1-Gbit DRAM Architecture With Micro-Pipelined 16-DRAM Cores, 8-ns Cycle Array and 16-Gbit/s 3D Interconnect for High Throughput Computing, IEEE Symposium on VLSI Circuits/Technical Digest of Technical Papers, 2010, pp. 187-188.

*Primary Examiner* — David Vu
*Assistant Examiner* — Brandon Fox
(74) *Attorney, Agent, or Firm* — Foley & Lardner LLP

(57) ABSTRACT

A semiconductor device is disclosed in which a plurality of memory cores are provided on a semiconductor chip. Each of the memory cores comprises: first and second circuit regions and a first and second through electrode groups. a first power supply is supplied in the first circuit region in which a data bus for parallel data is driven, and a second power supply separated from the first power supply is supplied in the second circuit region in which the parallel data and serial data are bidirectionally converted. The first through electrode group includes through electrodes supplying the first power supply to the first circuit region, and the second through electrode group includes through electrodes supplying the second power supply to the second circuit region.

6 Claims, 14 Drawing Sheets

(51) Int. Cl.
  *G11C 7/10* (2006.01)
  *G11C 11/4074* (2006.01)
  *G11C 11/4076* (2006.01)
  *G11C 11/4096* (2006.01)
  *G11C 5/04* (2006.01)
  *G11C 5/14* (2006.01)
  *H01L 25/065* (2006.01)
  *G11C 7/02* (2006.01)
  *H01L 25/18* (2006.01)

(56) References Cited

U.S. PATENT DOCUMENTS

2006/0233012 A1 10/2006 Sekiguchi et al.
2011/0156232 A1 6/2011 Youn et al.

* cited by examiner

SEMICONDUCTOR DEVICE AND MEMORY SYSTEM

CROSS-REFERENCE TO RELATED PATENT APPLICATIONS

This application claims priority to Japanese patent application no. 2011-217658, filed Sep. 30, 2011, the entire contents of which is incorporated herein by reference.

BACKGROUND OF THE INVENTION

1. Field of the Invention

The present invention relates to a semiconductor device comprising a plurality of memory cores implemented on a semiconductor chip, and a system in which the semiconductor chip and a control chip are stacked.

2. Description of Related Art

In recent years, a system has been proposed in which a multi-core memory including a plurality of memory cores is configured and a three-dimensional stacked structure is formed using through electrodes (TSVs: Through Silicon Vias) (for example, see Non-Patent Reference 1). Assuming a multi-core DRAM chip in which such a structure is applied to DRAM (Dynamic Random Access Memory), each DRAM core included in the multi-core DRAM chip is required to perform high-speed data communication through the TSVs. In order to achieve a high-speed multi-core DRAM, it is important that circuits including a data bus and an I/O circuit that transmit data through DQ terminals operate in high throughput. Further, the high-speed operation of these circuits requires measures against an increase in consumption current, influence of power supply noise between the circuits, and the like. Particularly, since various power supplies are used in accordance with functional blocks in a general configuration of DRAM (for example, see Patent Reference 1), it is desirable to suppress an increase in consumption current and cross-coupling noise between the circuits not only in a memory region, but also in peripheral circuits including the data bus, the I/O circuit and the like.

[Patent Reference 1] Japanese Patent Application Laid-open No. 2003-7059 (U.S. Pat. No. 6,411,560) [Non-Patent Reference 1] K. Ono, A. Kotabe, Y. Yanagawa and T. Sekiguchi, "1-Tbyte/s 1-Gbit DRAM Architecture with Micro-pipelined 16-DRAM Cores, 8-ns Cycle Array and 16-Gbit/s 3D Interconnect for High Throughput Computing," IEEE Symposium on VLSI Circuits/Technical Digest of Technical Papers, pp. 187-188 (2010).

In a read operation of a memory cell array, an output stage of the above DRAM core operates so that read data is transmitted to a data bus as parallel data of a predetermined number of bits and the read data is converted from parallel to serial form by an I/O circuit, thereby being externally outputted through DQ terminals. In a write operation of the memory cell array, write data is transmitted from the DQ terminals to the memory cell array through a reverse path. In order to improve the throughput in the above conventional configuration of the DRAM core, it is effective to increase the number of bits of the data bus and to increase an operating frequency. However, this causes a problem that the consumption current in the data bus increases in proportion to the number of bits of the data bus and the operating frequency respectively, which reaches an extremely larger value. Further, when driving many data buses in a data bus region, driving timings thereof overlap so as to increase temporal variation of the consumption current, and therefore this likely becomes power supply noise that affects the operation of the I/O circuit. Further, it is not easy to reduce line impedance of the power supplies in the data bus region and an I/O region for the purpose of dealing with such problems, since wiring structure is restricted in the DRAM core of which integration has been advanced. In this manner, in order to achieve the high-speed operation of the DRAM core, it is particularly required to overcome the performance problems due to the power supplies in the data bus region and the I/O region.

SUMMARY

A semiconductor device according to an embodiment of the disclosure comprises: a first chip including first and second voltage terminals electrically independent of each other and a first data terminal, the first and second voltage terminals being supplied with first and second voltages, respectively; and a second chip stacked with the first chip, the second chip that includes: third and fourth voltage terminals electrically coupled to the first and second voltage terminals of the first chip, respectively; a second data terminal electrically coupled to the first data terminal of the first chip; a memory circuit including a plurality of memory cells; a data control circuit coupled to the memory circuit; and a parallel-serial conversion circuit coupled between the second data terminal and the data control circuit, the parallel-serial conversion circuit being configured to receive a plurality of write data supplied in series from the second data terminal and transfer the plurality of write data in parallel to the data control circuit, and receive a plurality of read data in parallel from the memory circuit and transfer the plurality of read data in series to the second data terminal; the data control circuit being electrically coupled to the third voltage terminal to be supplied with the first voltage and electrically independent of the fourth voltage terminal, and the parallel-serial conversion circuit being electrically coupled to the fourth voltage terminal to be supplied with the second voltage and electrically independent of the third voltage terminal.

A semiconductor device according to an embodiment of the disclosure comprises: a semiconductor device comprising a plurality of memory cores on a semiconductor chip, each of the memory cores comprising: a first circuit region in which a data bus transmitting parallel data bidirectionally is driven, the first circuit region being supplied with a first power supply; a second circuit region in which the parallel data transmitted through the data bus and serial data transmitted via an external terminal are bidirectionally converted, the second region being supplied with a second power supply separated from the first power supply; a first through electrode group including a plurality of through electrodes that supply the first power supply to the first circuit region; and a second through electrode group including a plurality of through electrodes that supply the second power supply to the second circuit region.

In the semiconductor device of the invention, since operation frequencies in the first circuit region for driving the data bus and the second circuit region for performing parallel-serial conversion are different from each other, it is possible to achieve a wiring structure capable of reliably separating the first and second power supplies in the first and second circuit regions based on a difference in arrangement of the first through electrode group for the first power supply supplied to the first circuit region and the second through electrode group for the second power supply supplied to the second circuit region, in order to avoid influence of power supply noise that becomes a problem in an operation with a common power supply. That is, since the first and second through electrode groups can differ in position and orientation from each other, it is possible to easily obtain a distance by which mutual interference is suppressed and to reduce line impedance by increasing the degree of freedom of wiring layout, when forming lines of the power supplies in wiring layers. Thereby, the influence of noise between the first and second circuit regions is suppressed, and throughput of data transfer can be improved even when the number of bits of the data bus and the operation frequency are respectively increased.

A system according to an embodiment of the disclosure comprises: a multi-core memory chip including a plurality of memory cores; and a multi-core control chip including a plurality of control cores, wherein data is transmitted via a plurality of through electrodes between the multi-core memory chip and the multi-core control chip that are stacked, and each of the memory cores comprises: a first circuit region in which a data bus transmitting parallel data bidirectionally is driven, the first circuit region being supplied with a first power supply; a second circuit region in which the parallel data transmitted through the data bus and serial data transmitted via an external terminal are bidirectionally converted, the second region being supplied with a second power supply separated from the first power supply; a first through electrode group including a plurality of through electrodes that supply the first power supply to the first circuit region; and a second through electrode group including a plurality of through electrodes that supply the second power supply to the second circuit region.

DETAILED DESCRIPTION OF THE PREFERRED EMBODIMENTS

In the following, embodiments of a system will be described. In the embodiments, the invention is applied to a system comprising a multi-core DRAM chip stacked using TSVs (Through Silicon Vias) as through electrodes.

Figure 1A:
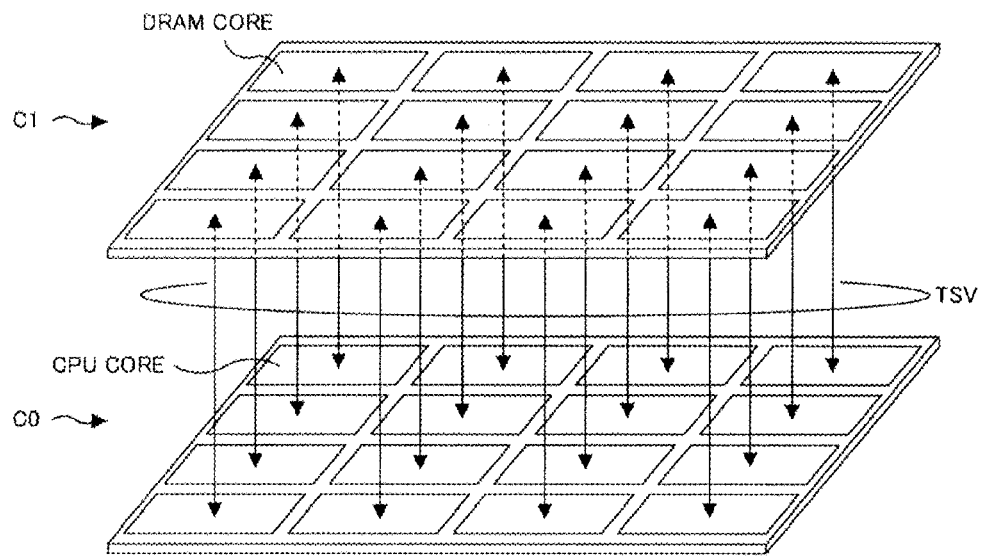
FIGS. 1A and 1B are conceptual diagrams explaining a system of an embodiment.
Figure 1B:
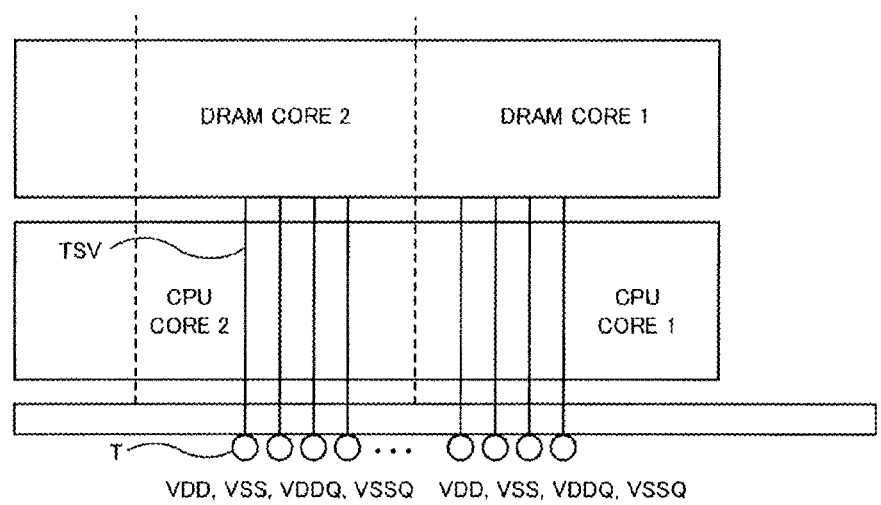

FIGS. 1A and 1B are conceptual diagrams explaining the system of an embodiment. In the system shown in FIG. 1A, a multi-core CPU chip C0 including a plurality of CPU cores and a multi-core DRAM chip C1 including a plurality of DRAM cores are stacked, and each of the CPU cores is electrically connected to a corresponding one of the DRAM cores by a plurality of TSVs. Each CPU core is a functional unit of the multi-core CPU chip C0, and each DRAM core is a functional unit of the multi-core DRAM chip C1. Each DRAM core of the multi-core DRAM chip C1 functions as a main memory, a DRAM local memory or a cache memory of a corresponding CPU core of the multi-core CPU chip C0, and data and control signals are transmitted between each CPU core and the corresponding DRAM core through the TSVs. When employing the configuration of FIG. 1A, it is required to perform high-speed communication with high throughput between the CPU cores and the DRAM cores through the TSVs. The system of this embodiment can achieve the communication with high throughput by devising a structure of a power supply wiring, as described below.

FIG. 1B is an enlarged view of a cross-sectional structure of FIG. 1A, which includes two adjacent DRAM cores (1 and 2) and two adjacent CPU cores (1 and 2). As shown in FIG. 1B, power supplies used in each core are supplied from external terminals T. Each CPU core is supplied with the power supplies through a plurality of external terminals on a bottom surface respectively coupled to a plurality of TSVs penetrating the CPU core. Each CPU core further includes a plurality of external terminals on a top surface such that each of the TSVs coupled between a corresponding one of the external terminals on the bottom surface and a corresponding one of the external terminals on the top surface. On the other hand, each DRAM core stacked in a so-called face-down state (having a wiring surface facing downward) is supplied with the power supplies without forming the TSVs inside the DRAM core. However, each DRAM core stacked in a so-called face-up state (having a wiring surface facing upward) is supplied with the power supplies by using the TSVs formed inside the DRAM core.

Figure 2:
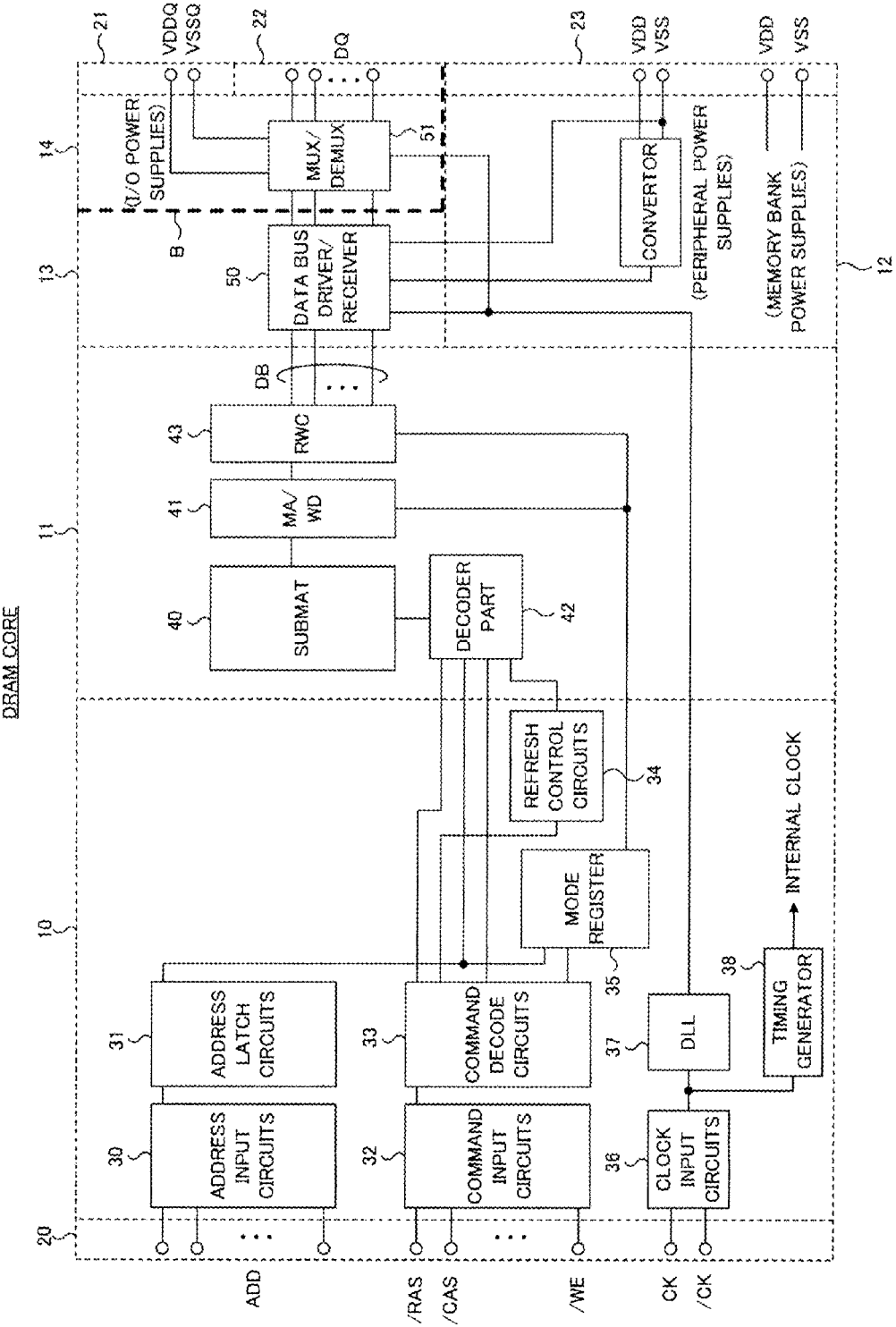
FIG. 2 is an entire block diagram of one DRAM core included in a multi-core DRAM chip C1 of the embodiment.

Next, an overview of configuration and operation of the multi-core DRAM chip C1 of an embodiment will be described with reference to FIGS. 2 to 6. FIG. 2 is an entire block diagram of one DRAM core included in the multi-core DRAM chip C1 of the embodiment. An entire region of the DRAM core shown in FIG. 2 can be divided into a core control region 10, a memory bank region 11, a power supply region 12, a data bus driving region 13, and an I/O region 14. Further, a plurality of TSVs formed in the DRAM core include a control TSV group 20, an I/O power supply TSV group 21, a DQ TSV group 22, and a peripheral power supply TSV group 23.

The core control region 10 for controlling operations of the DRAM core includes an address input circuit 30 that receives an address (ADD) from outside, an address latch circuit 31 that latches the address sent from the address input circuit 30, a command input circuit 32 that receives a command (/RAS, /CAS, /WE and the like) from outside, a command decoder circuit 33 that decodes the command sent from the command input circuit 32, a refresh control circuit 34 that controls a refresh operation when a refresh command is sent from the command decoder circuit 33, a mode register 35 that selectively sets operation modes of the DRAM core corresponding to predetermined command and address, a clock input circuit 36 that receives external clocks (CK and /CK), a DLL 37 that controls data transfer timing based on the external clocks, and a timing generator 38 that generates internal clocks determining timings at various parts based on the external clocks. All of the address, the command and the external clocks are supplied from outside (for example, from the multi-core CPU chip C0) through the control TSV group 20.

The memory bank region 11 is a memory region including a plurality of memory banks (not shown in FIG. 1A) arranged in the DRAM core. Further, each memory bank in the memory bank region 11 includes a plurality of sub-mats 40 each as a unit region and peripheral circuits. FIG. 2 shows circuits associated with one sub-mat 40, in which there are provided one main amplifier/write driver part (MA/WD) 41 including a plurality of main amplifiers and a plurality of write drivers attached to each memory bank, a decoder part 42 including a row decoder and a column decoder attached to each memory bank, and a read/write circuit (RWC) 43 reading and writing data through the data bus driving region 13 and the data bus DB.

The power supply region 12 includes circuits supplying externally input power supplies and internally generated power supplies to various parts in the DRAM core. In the example of FIG. 2, a peripheral power supply TSV group 23 (the first through electrode group) includes TSVs for transmitting a power supply voltage VDD and a ground potential VSS, and the TSVs are connected to the power supply region 12, in which various power supply voltages used in the core control region 10 and the memory bank region 11 are generated or directly supplied. Further, in the power supply region 12, various power supply voltages used in the data bus driving region 13 are also generated or directly supplied through the peripheral power supply TSV group 23. In the FIG. 2, there is a convertor between the peripheral power supply TSV group 23 and a data bus driver/receiver circuit 50 to supply a converted voltage VPERI to the data bus driver/receiver circuit 50. The peripheral power supply TSV group may be coupled to the data bus driver/receiver circuit 50 without the converter to supply the power supply voltage VDD to the data bus driver/receiver circuit 50. Each DRAM core may employ a configuration of supplying the power supply voltages from outside through the TSVs, if necessary, depending on the intended use thereof. In addition, the I/O power supply TSV group 21 (the second through electrode group) separated from the peripheral power supply TSV group 23 will be described later.

The data bus driving region 13 (the first circuit region) includes a data bus driver/receiver circuit 50 that drives a plurality of data buses DB for bidirectionally transmitting read/write data of the read/write circuit 43. The I/O region 14 (the second circuit region) includes a multiplexer/demultiplexer circuit 51 for bidirectionally converting parallel data transmitted through the data bus driver/receiver circuit 50 and serial data inputted/outputted through DQ terminals. Further, the multiplexer/demultiplexer circuit 51 is electrically connected to the DQ TSV group 22 functioning as a plurality of DQ terminals (external terminals). The above configuration enables a write operation for writing write data received from the DQ TSV group 22 into the memory bank and a read operation for outputting read data from the memory bank to outside through the DQ TSV group 22. It is a feature in the configuration of the embodiment that the power supplies are separated at a boundary B between the data bus driving region 13 and the I/O region 14, which will be described below.

Figure 3:
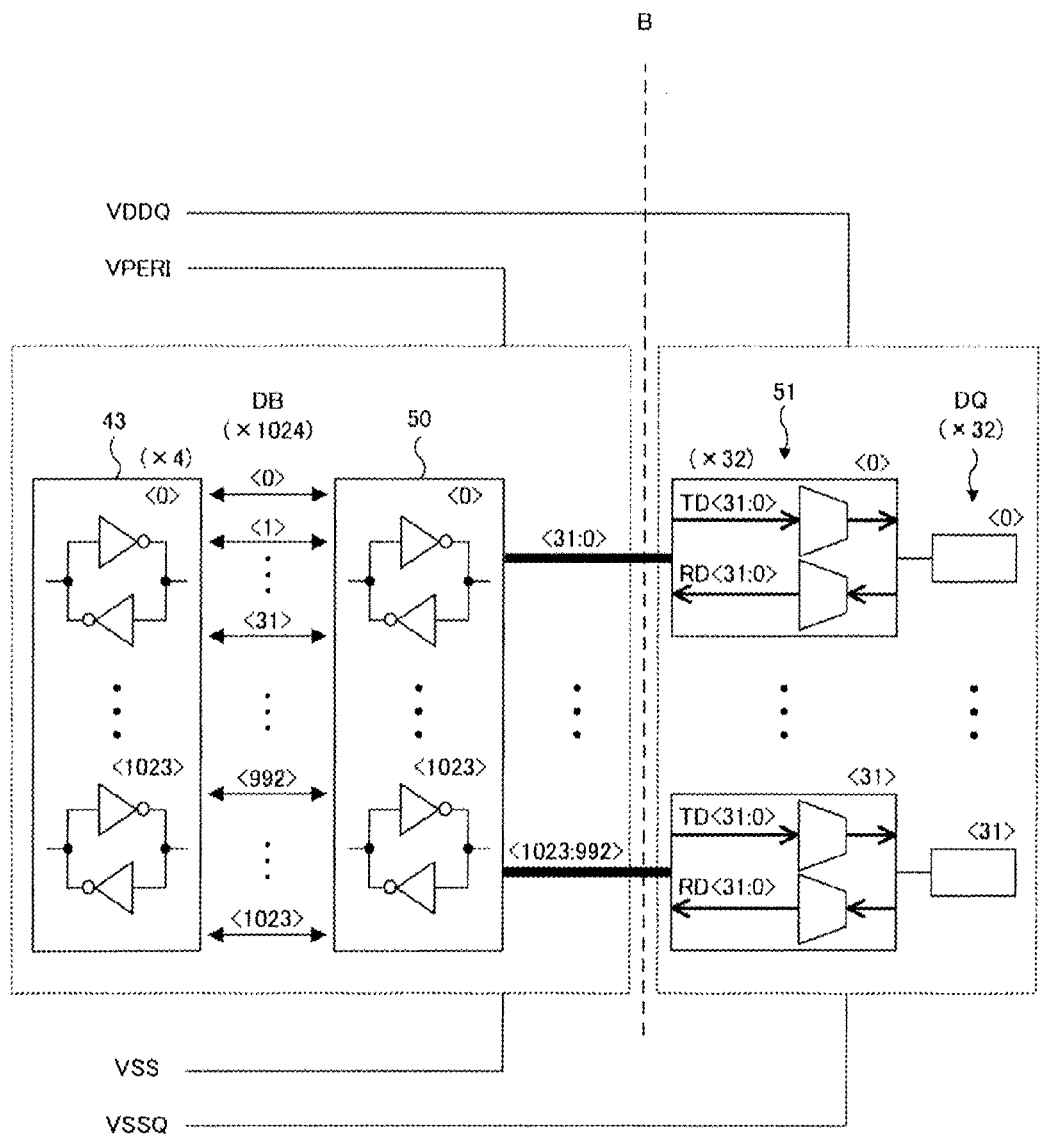
FIG. 3 is a partial block diagram of a range including elements associated with separation of power supplies in the entire block diagram of FIG. 2.

FIG. 3 is a partial block diagram of a range including elements associated with the separation of the power supplies in the entire block diagram of FIG. 2, in which there are provided the read/write circuit 43, the data bus DB, the data bus driver/receiver circuit 50 in the data bus driving region 13, the multiplexer/demultiplexer circuit 51 in the I/O region 14, and the DQ terminals. Here, parallel transfer of 1024-bit data through the data bus DE is assumed in the example of FIG. 3. Thus, the read/write circuit 43 includes 1024 bidirectional buffers connected to one ends of 1024 lines of the data bus DB. The data bus driver/receiver circuit 50 includes 1024 drivers/receivers connected to the other ends of the 1024 lines of the data bus DB. The multiplexer/demultiplexer circuit 51 includes 32 unit circuits respectively connected to 32 DQ terminals. Each of these unit circuits includes a multiplexer MUX that converts 32-bit parallel data (TD) from the data bus driver/receiver circuit 50 into 1-bit serial data and transfers the data to each DQ terminal, and a demultiplexer DEMUX that converts 1-bit serial data from each DQ terminal into 32-bit parallel data (RD) and transfers the data to the data bus driver/receiver circuit 50.

As shown in FIG. 3, the power supplies are separated at the boundary B between the data bus driving region 13 and the I/O region 14. That is, one or more peripheral power supplies (the first power supply) are supplied to the side of the data bus driving region 13 (including the read/write circuit 43), while one or more I/O power supplies (the second power supply) are supplied to the side of the I/O region 14. The peripheral power supplies include, for example, a pair of a power supply voltage VPERI and the ground potential VSS, which are supplied through the peripheral power supply TSV group 23 and the power supply region 12 of FIG. 2. The I/O power supplies include, for example, a pair of a power supply voltage VDDQ and a ground potential VSSQ, which are supplied through the I/O power supply TSV group 21 of FIG. 2. In the embodiment, by separating the peripheral power supplies and the I/O power supplies using a devised wiring structure described later, mutual interference between the data bus driving region 13 and the I/O region 14 can be reduced so as to suppress the influence of noise, and line impedance of each power supply can be reduced.

Figure 4:
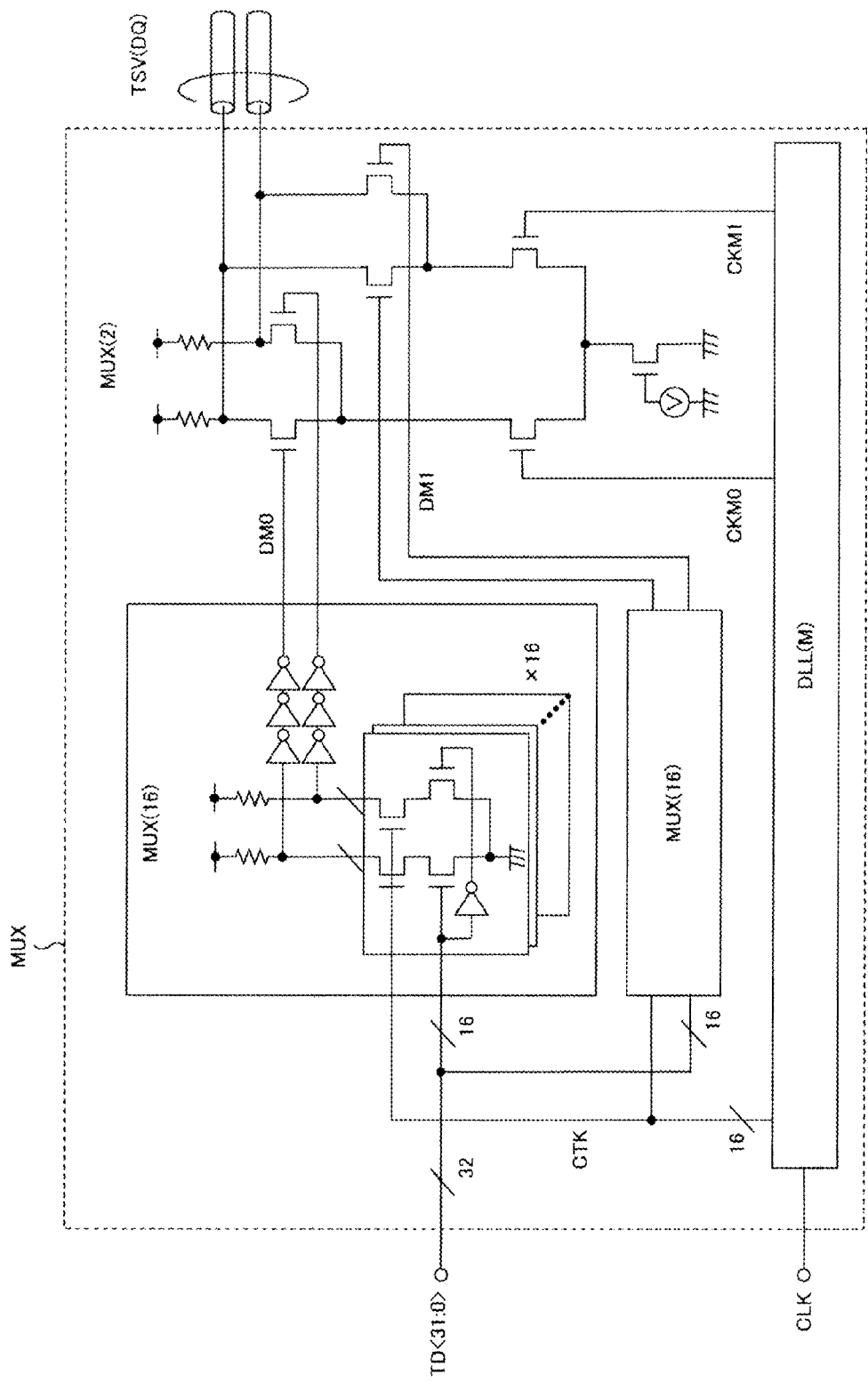
FIG. 4 is a diagram showing a circuit configuration example of a multiplexer MUX of FIG. 3.

Hereinafter, circuit configurations of the multiplexer MUX and the demultiplexer DEMUX included in FIG. 3 will be described. FIG. 4 shows a circuit configuration example of the multiplexer MUX, which includes two 16-bit multiplexers MUX(16) each converting 16-bit parallel data into 1-bit serial data, one 2-bit multiplexer MUX(2) converting 2-bit parallel data from the two 16-bit multiplexers MUX(16) into 1-bit serial data, and a DLL(M) controlling operation timings at various parts of the multiplexer MUX. Each of the 16-bit multiplexers MUX(16) includes sixteen unit circuits operating at different timings in response to a clock CTK generated using a reference clock CLK in the DLL(M). 32-bit transmission data TD<31:0> inputted to the multiplexer MUX is divided up into 16-bit pieces, which are inputted to the above two multiplexers MUX(16), respectively. The above sixteen unit circuits in each of the 16-bit multiplexers MUX(16) operate at different timings, and thereby each of the 16-bit multiplexers MUX(16) outputs complementary data signals DM0 and DM1. Each of the 2-bit multiplexers MUX(2) that receive the above data signal DM0 or DM1 outputs complementary data that changes based on clocks CKM0 and CKM1 supplied from the DLL(M), and this data is outputted to outside through a pair of TSVs (DQ terminals). The multiplexer MUX shown in FIG. 4 operates in current mode logic, and approximately constant current flows therein during an operation so that no peak appears in consumption current.

Figure 5:
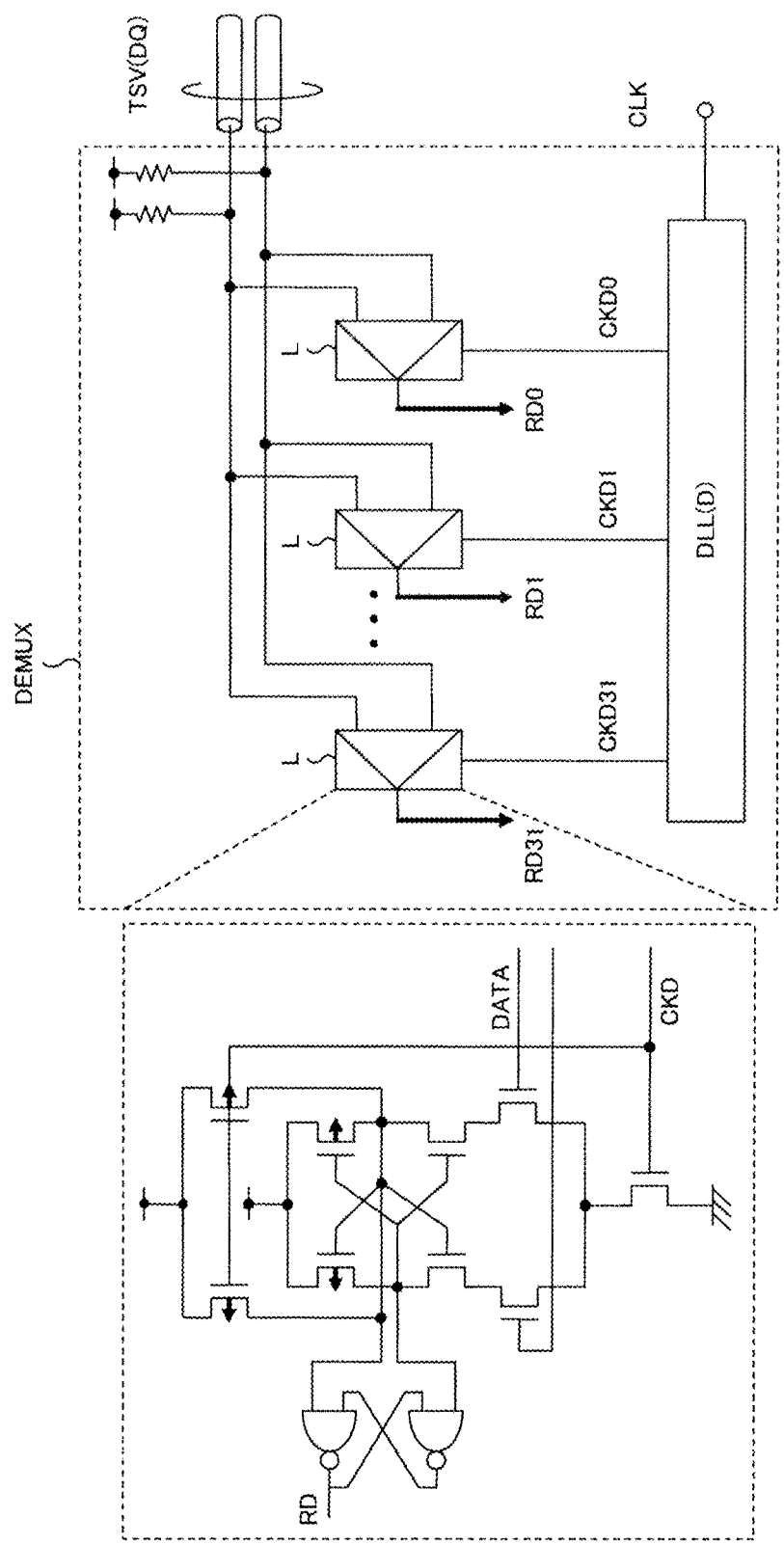
FIG. 5 is a diagram a circuit configuration example of a demultiplexer DEMUX of FIG. 3.

Meanwhile, FIG. 5 shows a circuit configuration example of the demultiplexer DEMUX, which includes 32 latch circuits L each receiving the serial data, and a DLL(D) controlling operation timings of the respective latch circuits L. As shown in the left side of FIG. 5, each of the latch circuits L receives the complementary data through the pair of TSVs (DQ terminals) into a circuit having a differential configuration, and is activated at a predetermined timing according to a clock CKD generated by the DLL(D) based on the reference clock CLK so as to output received data RD. By supplying 32 clocks CKD0 to CKD31 to the 32 latch circuits L in the alignment sequence, received data RD0 to RD31 as the 16-bit parallel data can be extracted by activating the 32 latch circuits L in this sequence. In this manner, although large consumption current flows through the 32 latches L in the demultiplexer DEMUX shown in FIG. 5, the consumption current is temporally dispersed so that no peak appears therein since the 32 latches L are activated at timings different from one another. As described above, the circuit configurations of FIGS. 4 and 5 indicate that a temporal change in the consumption current in the I/O region 14 is small.

Figure 6:
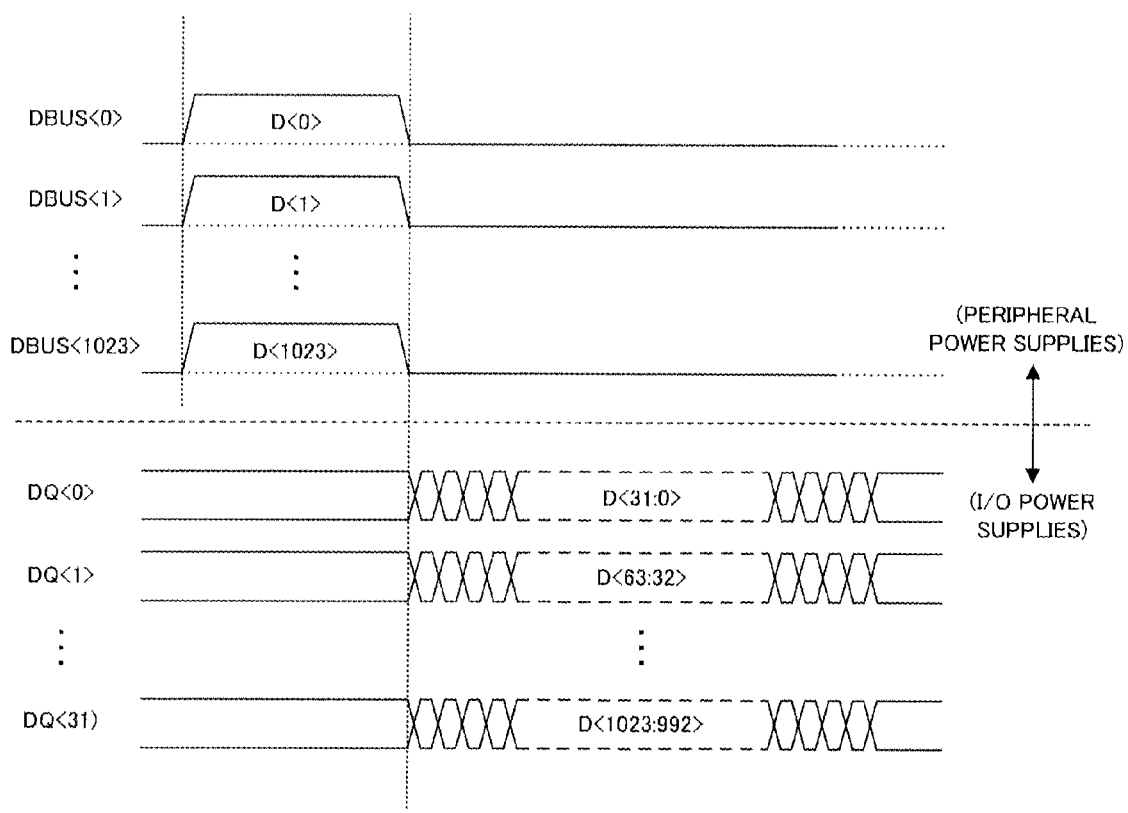
FIG. 6 is a diagram showing a specific example of a read operation in a circuit configuration of FIG. 3.

FIG. 6 shows a specific example of a read operation in the circuit configuration of FIG. 3. As shown in the upper part of FIG. 6, 1024-bit data D<0> to D<1023> sent from the read/write circuit 43 are transmitted to the data bus driver/receiver circuit 50 through a 1024-bit data bus DB<0> to DB<1023>. Subsequently, as shown in the lower part of FIG. 6, each 32-bit piece of data D sent from the data bus driver/receiver circuit 50 is converted into serial data by each of the 32 multiplexers MUX of the multiplexer/demultiplexer circuit 51 and is outputted to outside from each of the 32 DQ terminals (DQ<0> to DQ<31>).

In FIG. 6, an operating frequency of the data bus driving region 13 to which the peripheral power supplies are supplied is, for example, 0.5 GHz, and in contrast, since high-speed parallel-serial conversion is required in the I/O region 14 to which the I/O power supplies are supplied, an operating frequency thereof is, for example, 8 GHz. Thus, when clock skew due to power supply noise occurs, operating margin of the I/O region 14 becomes much lower. Further, the temporal variation of the consumption current is small in the I/O region 14, as described above. In contrast, the data bus driving region 13 requires a large consumption current for charging/discharging a number of the data buses DB, and thereby it is required to reduce power supply impedance. In the embodiment, in consideration of differences in operating speed and circuit characteristics between the data bus driving region 13 and the I/O region 14, the power supplies of the both are separated by forming a wiring structure described later, and thereby it is possible to achieve a suppression of the power supply noise and a reduction in the power supply impedance.

Figure 7:
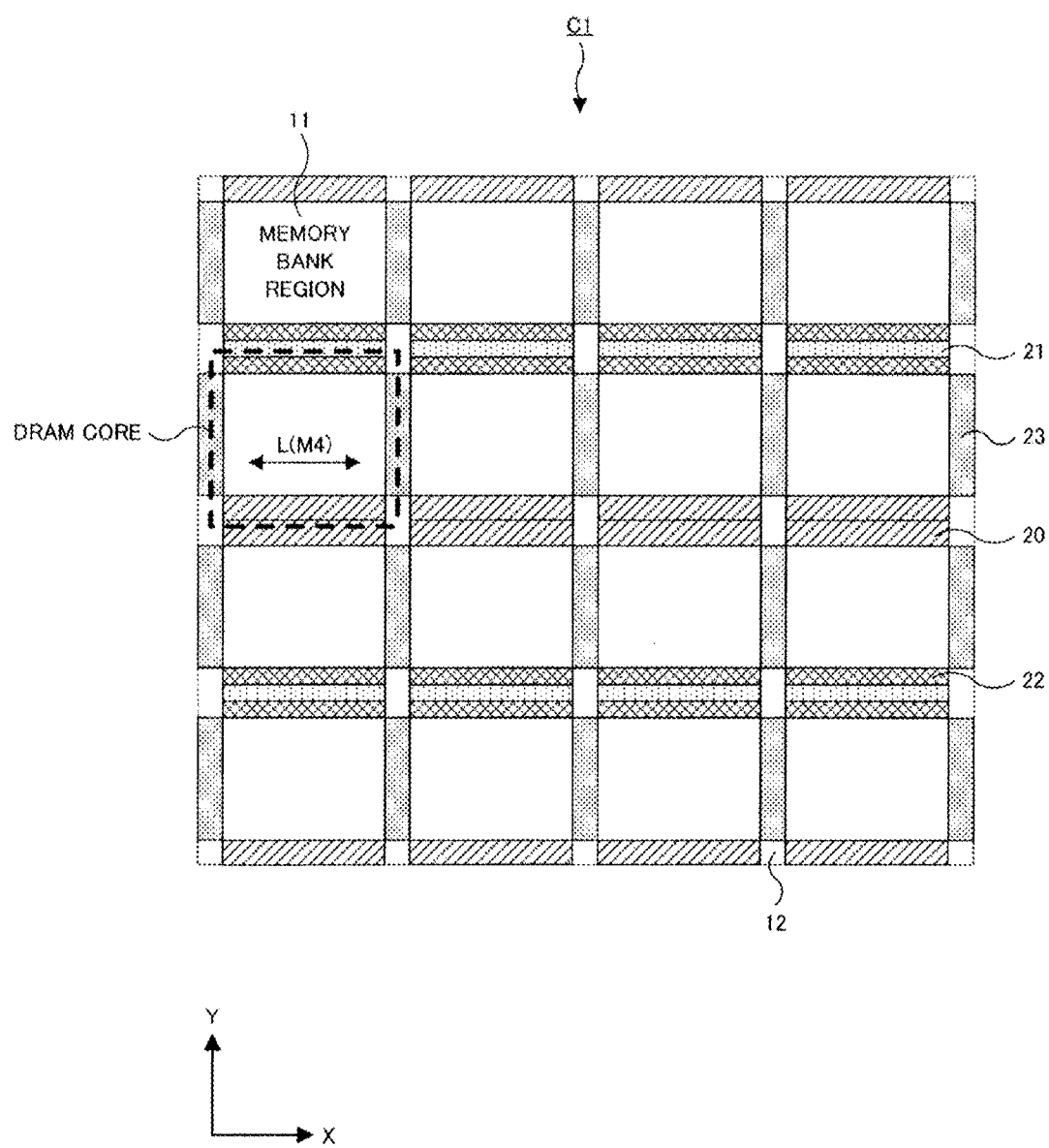
FIG. 7 is a plane view showing an entire layout of the multi-core DRAM chip C1 of an embodiment.

Next, layout and wiring structure of the multi-core DRAM chip C1 of an embodiment will be described with reference to FIGS. 7 to 14. FIG. 7 is a plane view showing an entire layout of the multi-core DRAM chip C1 of the embodiment. In the lower part of FIG. 7, arrows of an X direction (the second direction) and a Y direction (the first direction) that intersect with each other in a plane are indicated for explanatory purposes. Hereinafter, the X and Y directions shown in figures below have the same meaning. The multi-core DRAM chip C1 shown in FIG. 7 includes 16 DRAM cores in total (4 in the X direction and 4 in the Y direction). In each DRAM core, the memory bank region 11 shown in FIG. 2 is arranged in the center, and around the memory bank region 11, there are arranged the control TSV group 20, the I/O power supply TSV group 21 and the DQ TSV group 22 respectively along the X direction, while there is arranged the peripheral power supply TSV group 23 along the Y direction. In regions where the control TSV group 20 and the peripheral power supply TSV group 23 intersect with each other, there is arranged the power supply region 12 (FIG. 2). It is a feature of the embodiment that the I/O power supply TSV group 21 and the peripheral power supply TSV group 23 that are used for the power supplies separated at the boundary B (FIG. 3) are arranged in directions orthogonal to each other (directions interesting with each other), of which the specific wiring structure will be described later.

Figure 8:
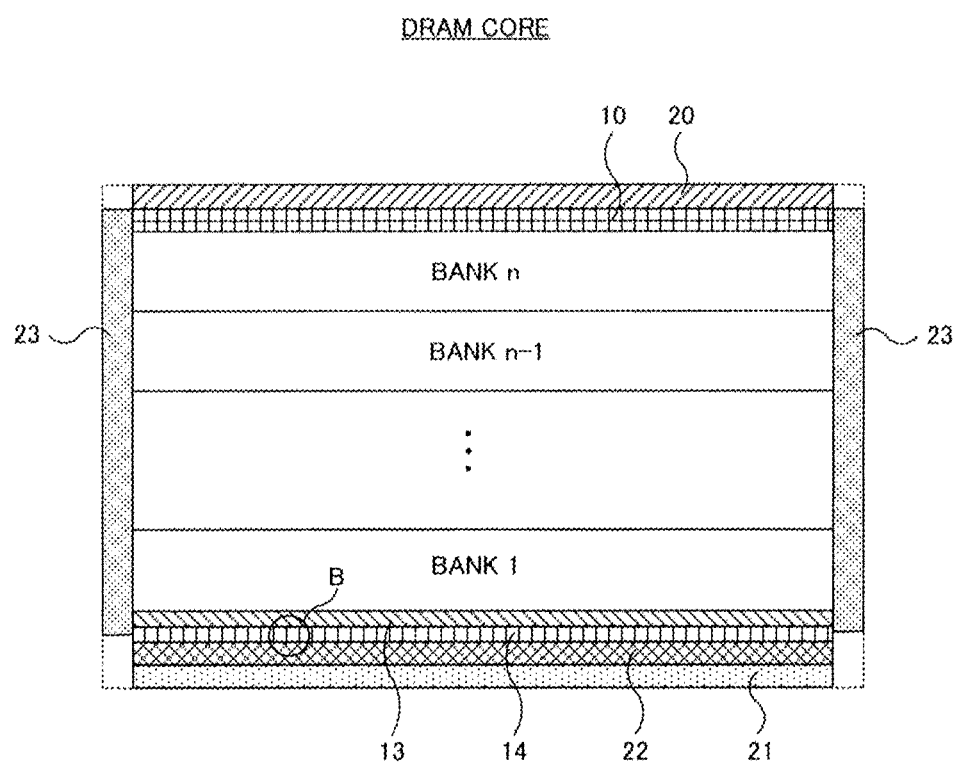
FIG. 8 is a diagram showing a planar structure of one DRAM core included in the plane view of FIG. 7.

A planar structure of one DRAM core (for example, a DRAM core at the top left corner) included in the plane view of FIG. 7 will be described using FIGS. 8, 9A and 9B. As shown in FIG. 8, there are provided N memory banks (BANK1 to BANKn) aligned in the Y direction in the memory bank region 11 (FIG. 7) in the DRAM core. The data bus driving region 13 and the I/O region 14 are arranged adjacent to a memory bank (BANK1) at one end, and the core control region 10 is arranged adjacent to a memory bank (BANKn) at the other end. Further, the DQ TSV group 22 and the I/O power supply TSV group 21 along the X direction are arranged adjacent to the I/O region 14, and the control TSV group 20 along the X direction is arranged adjacent to the core control region 10. Meanwhile, the peripheral power supply TSV groups 23 along the Y direction are respectively arranged at both ends of the memory bank region 11. Here, FIG. 8 shows the boundary B that is a position where the power supplies of the data bus driving region 13 and the I/O region 14 are separated from each other.

Figure 9A:
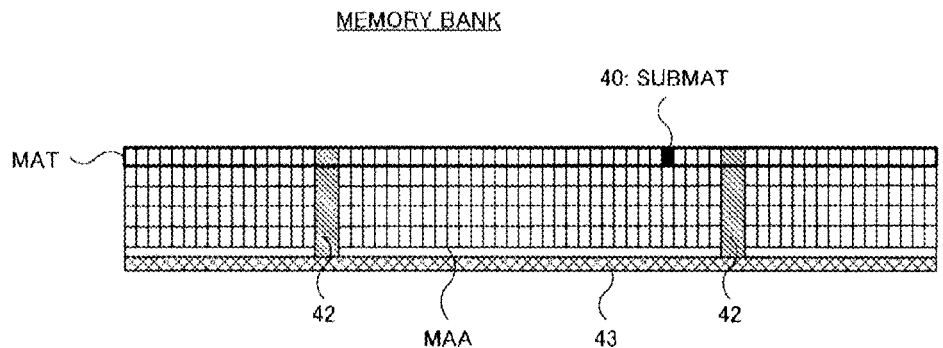
FIGS. 9A and 9B are diagrams showing enlarged planer structures of each memory bank in a memory bank region 11 of FIG. 8 and of a sub-mat 40 in each memory bank.

FIG. 9A shows an enlarged planer structure of each memory bank in the memory bank region 11 of FIG. 8. An arbitrary memory bank (BANKi) in the memory bank region 11 is divided into a plurality of memory mats MAT arranged in the Y direction. A main amplifier array MAA in the main amplifier/write driver part 41 (FIG. 2) and the read/write circuit 43 (FIG. 2) are arranged at one end of the arranged plurality of memory mats MAT. Each memory mat MAT is divided into the plurality of sub-mats 40 (FIG. 2) arranged in the X direction. The decoder part 42 (FIG. 2) including the row and column decoders is arranged at a quarter position and a three-quarter position along the X direction in the memory bank.

Figure 9B:
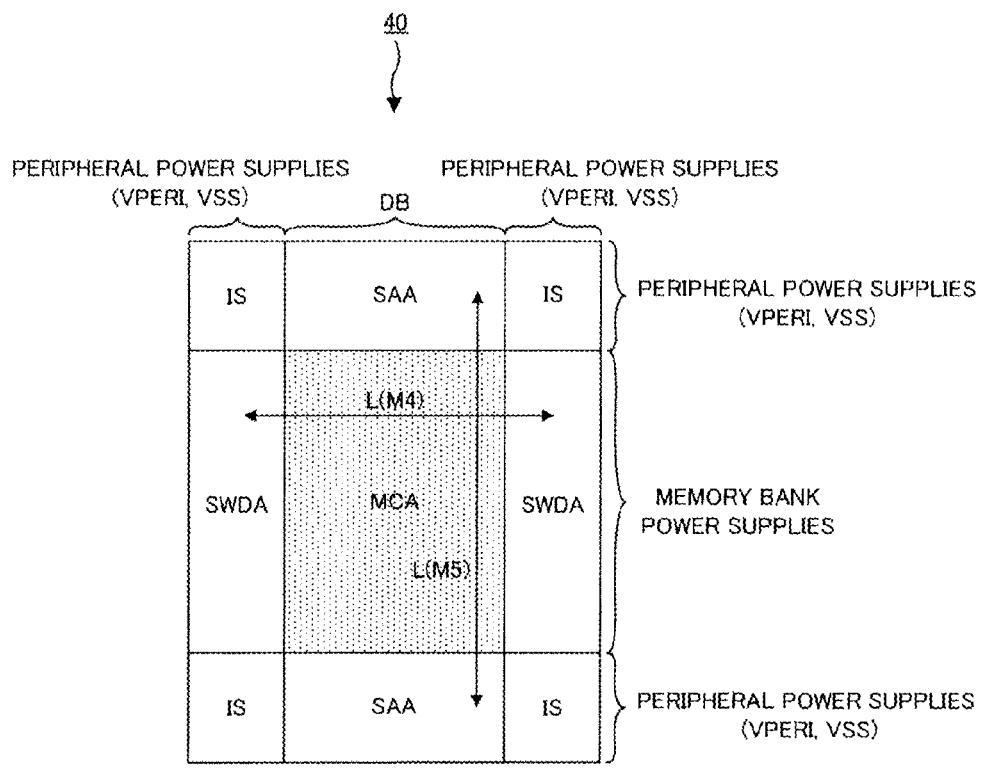

FIG. 9B shows a further enlarged structure of the sub-mat 40 of FIG. 9A. The sub-mat 40 as a unit region includes a memory cell array MCA including a plurality of memory cells storing data, sense amplifier arrays SAA arranged on both sides of the memory cell array MCA in the Y direction, sub-word driver arrays SWDA arranged on both sides of the memory cell array MCA in the X direction, and intersection portions IS arranged in regions where the sense amplifier arrays SAA and the sub-word driver arrays SWDA intersect with each other. A plurality of word lines extending in the X direction and a plurality of bit lines extending in the Y direction are arranged in the memory cell array MCA. A plurality of sense amplifiers respectively connected to one ends of the bit lines are aligned in the X direction in each of the sense amplifier arrays SAA. A plurality of sub-word drivers respectively connected to one ends of the word lines are aligned in the Y direction in each of the sub-word driver arrays SWDA.

Assuming that five wiring layers are formed on the multi-core DRAM chip C1 of the embodiments, wiring lines of power supplies or circuit connections are mainly formed in an uppermost wiring layer M5 (the first wiring layer) and in a wiring layer M4 (the second wiring layer) located immediately therebeneath. As shown in FIG. 9B, a line group L(M5) formed along the Y direction in the wiring layer M5 includes lines of the peripheral power supplies over the sub-word driver arrays SWDA and lines of the data bus DB and the peripheral power supplies over the memory cell array MCA. Further, a line group L(M4) formed along the X direction includes lines of the peripheral power supplies over the sense amplifier arrays SAA and lines of memory bank power supplies over the memory cell array MCA. Here, the lines of the peripheral power supplies are used for the power supply voltage VPERI and the ground potential VSS, for example, and the lines of the memory bank power supplies are used for various power supplies such as a step-down power supply, a boost power supply, a memory cell power supply and the like.

Within a range of the sub-mat 40 of the embodiment, only the lines of the peripheral power supplies are formed and lines of the I/O power supplies are not formed. That is, since the peripheral power supply TSV group 23 and the I/O power supply TSV group 21 have the positional relation shown in FIG. 8, only the lines of the peripheral power supplies are formed within the range of FIG. 9B so that they are reliably separated from the lines of the I/O power supplies. A wiring structure of the lines of the I/O power supplies will be described later. Further, since the line groups L(M4) and L(M5) extending in directions different from each other are formed using the two wiring layers M5 and M4, the degree of freedom of wiring layout can be increased and a large effect of reducing the power supply impedance can be obtained. In this case, electrical connections between the wiring layers M4 and M5 can be freely made by contacts as described later, thereby obtaining higher degree of freedom of the electrical connections. Further, the data bus DB having a large number of lines can be arranged in an empty space of the line groups L(M4) and L(M5).

Figure 10:
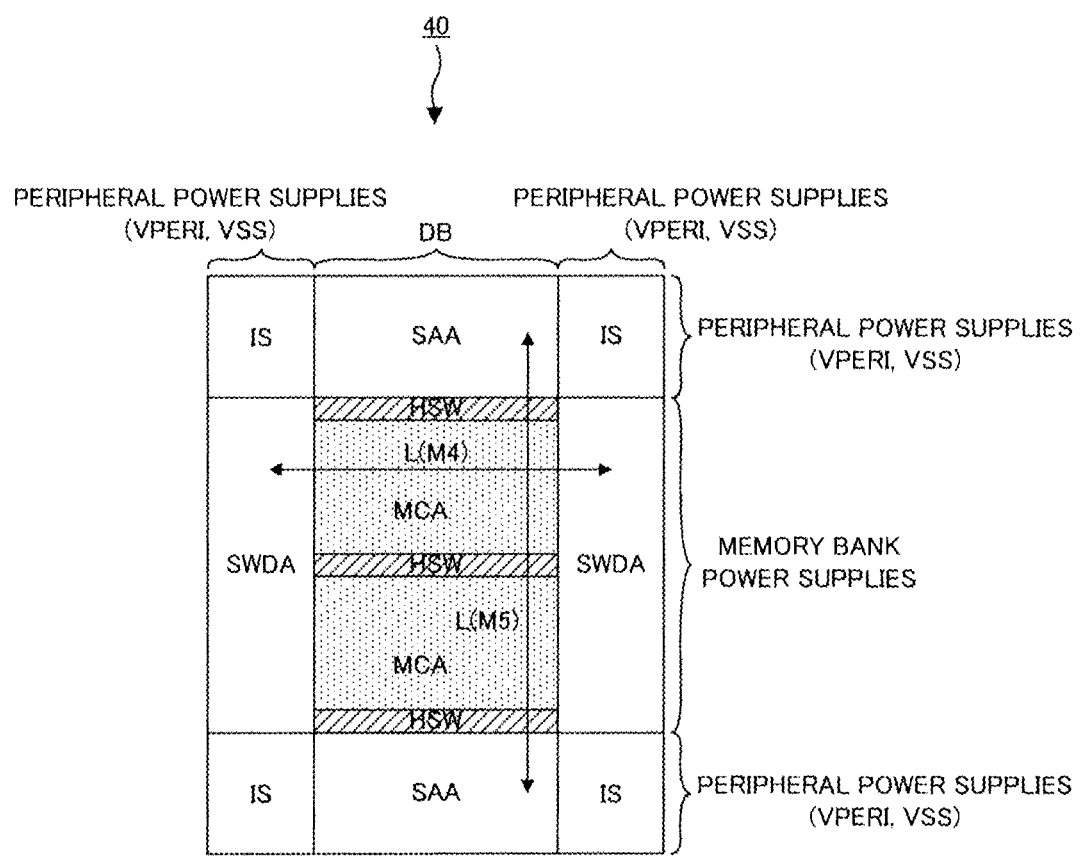
FIG. 10 is a diagram showing a modification of the structure of the sub-mat 40 of FIG. 9B.

Here, FIG. 10 shows a modification of the structure of the sub-mat 40 of FIG. 9B. In the modification of FIG. 10, differences from FIG. 9B are that the memory cell array MCA in the sub-mat 40 is divided into a plurality of memory cell arrays MCA as sub-arrays arranged in the Y direction, and that there are provided a plurality of hierarchical switch portions HSW adjacent in the Y direction to the respective memory cell arrays MCA. A hierarchical bit line structure is applied to the modification of FIG. 10, in which bit lines are hierarchized into upper global bit lines and lower local bit lines and each of the global bit lines is selectively connected to a predetermined number of local bit lines through unit switches in the hierarchical switch portions HSW. In FIG. 10, the line group L(M4) formed in the wiring layer M4 includes lines of the peripheral power supplies supplied to the respective hierarchical switch portions HSW, in addition to operating in the same manner as in FIG. 9B. In FIG. 10, the line group L(M5) formed in the wiring layer M5 operates in the same manner as in FIG. 9B.

Figure 11:
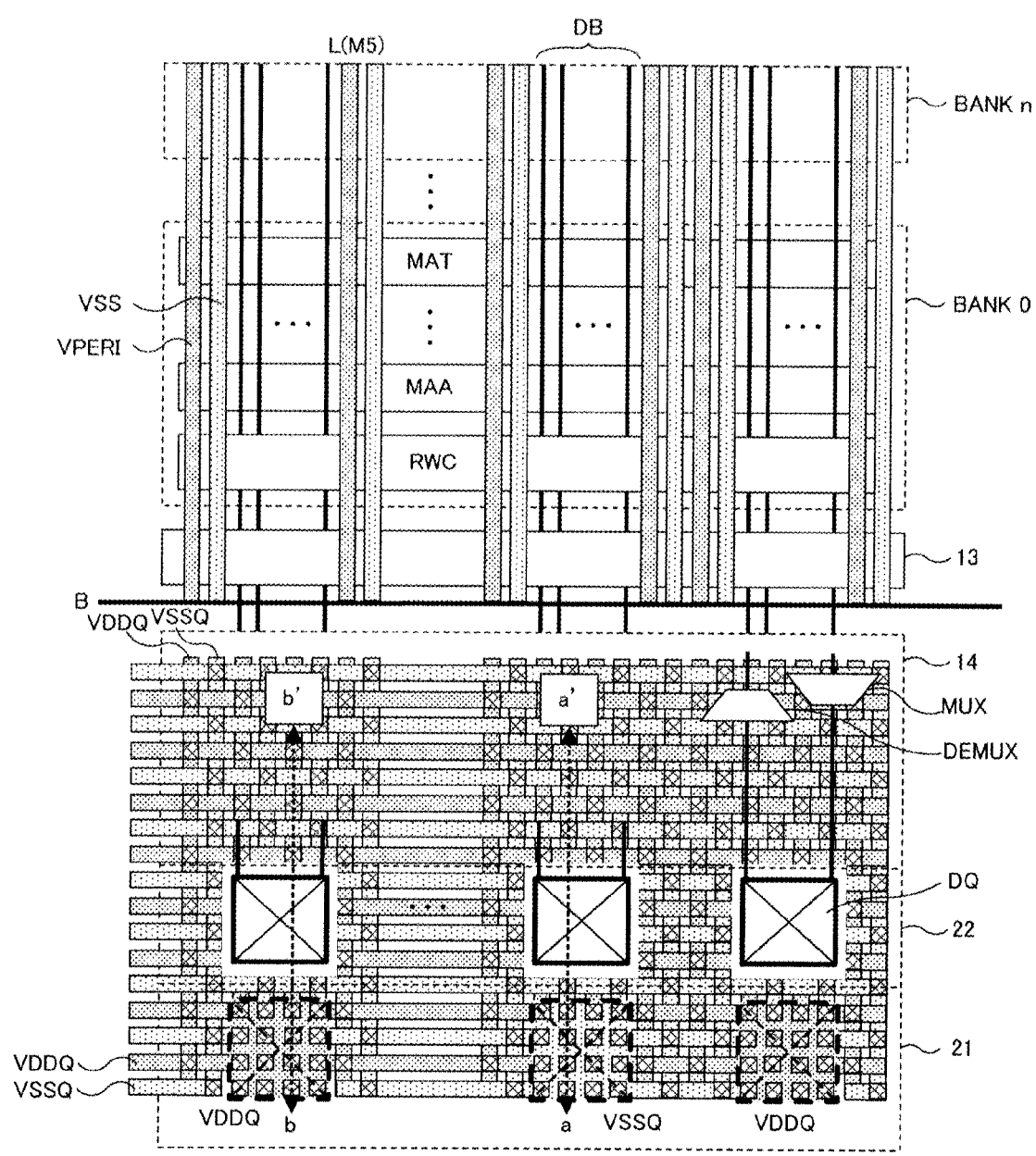
FIG. 11 is a diagram showing an integral structure including a planar structure of a wiring layer M5 of the memory bank region 11 and planar structures of a wiring layer M4 regarding a discriminative wiring structure in the DRAM core.
Figure 12A:
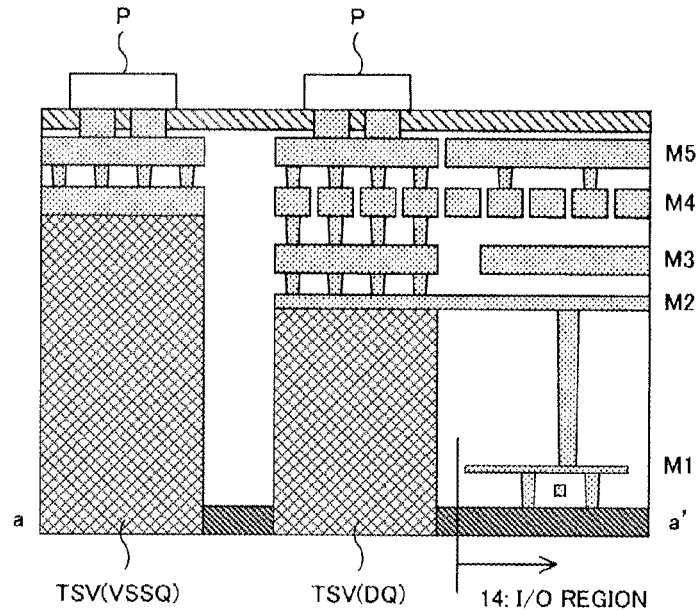
FIGS. 12A and 12B are diagrams showing cross-sectional structures at respective sections of FIG. 11.
Figure 12B:
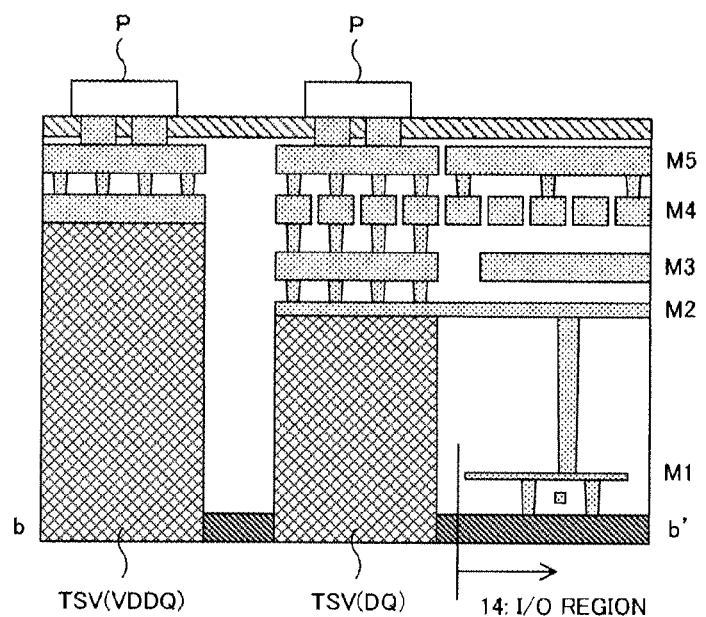

Next, a discriminative wiring structure in the DRAM core of FIG. 8 will be described using FIGS. 11, 12A and 12B. FIG. 11 shows an integral structure including a planar structure of the wiring layer M5 in the vicinity of the memory bank region 11 and the data bus driving region 13 and planar structures of the wiring layers M4 and M5 in the vicinity of the data bus driving region 13 and the I/O region 14. Further, FIG. 12A shows a cross-sectional structure at an a-a' section of FIG. 11, and FIG. 12B shows a cross-sectional structure at a b-b' section of FIG. 11. In the cross-sectional structures of FIGS. 12A and 12B, a lateral direction of the figures is the above Y direction and a longitudinal direction of the figures is a stacking direction (vertical direction) of the multi-core DRAM chip C1.

As shown in FIG. 11, the data bus DB is formed along the Y direction in the wiring layer M5 over the memory bank region 11 and the data bus driving region 13. The data bus DB extends to the I/O region 14 through circuits in the data bus driving region 13 (not shown in FIG. 11), and is electrically connected to input terminals of the multiplexers MUX and output terminals of the demultiplexers DEMUX. Further, output terminals of the multiplexers MUX and input terminals of the demultiplexers DEMUX are electrically connected to predetermined TSVs (DQ) included in the DQ TSV group 22. As shown as an example in the cross-sectional structures of FIGS. 12A and 12B, each TSV (DQ) of the DQ TSV group 22 has an upper end reaching the wiring layer M2 and is electrically connected to a predetermined node extending from the I/O region 14 (on the right sides of FIGS. 12A and 12B). In the I/O region 14, the lower wiring layers M1 and M2 are connected to each other in the stacking direction. Further, pads P are formed at the uppermost end of an area over the TSVs (DQ), and the pads P are electrically connected to the respective wiring layers M1 to M5 through predetermined paths. In addition, the pads P are omitted in FIG. 11 for the sake of visibility.

Meanwhile, power supply lines including alternately arranged lines of the power supply voltage VPERI and the ground potential VSS are formed along the Y direction in the wiring layer M5 over the memory bank region 11 and the data bus driving region 13 of FIG. 11. Further, power supply lines including lines of the power supply voltage VDDQ and the ground potential VSSQ are formed along the Y direction in the upper wiring layer M5 extending over the I/O region 14, the DQ TSV group 22 and the I/O power supply TSV group 21. Power supply lines including lines of the power supply voltage VDDQ and the ground potential VSSQ are formed along the X direction in the upper wiring layer M4 extending over the I/O region 14, the DQ TSV group 22 and the I/O power supply TSV group 21. Contacts are formed at positions where the respective power supply lines of the opposite wiring layers M4 and M5 intersect each other, and corresponding ones of the power supply lines are electrically connected to each other. In this manner, in the wiring layers M4 and M5 shown in the lower part of FIG. 11, the power supply lines including the lines of the power supply voltage VDDQ and the ground potential VSSQ are arranged in a mesh shape. These power supply lines are electrically connected to predetermined TSVs (VDDQ) and TSVs (VSSQ) that are included in the I/O power supply TSV group 21 adjacent to the DQ TSV group 22. As shown as an example in the cross-sectional structures of FIGS. 12A and 12B, each of the TSVs (VDDQ) or the TSVs (VSSQ) of the I/O power supply TSV group 21 has an upper end reaching the wiring layer M4, and is electrically connected to a power supply line corresponding to the power supply voltage VDDQ or the ground potential VSSQ through a plurality of contacts. Further, pads P are formed at the uppermost end of an area over the TSVs (VDDQ) or the TSVs (VSSQ), and the pads P are electrically connected to predetermined positions of the wiring layer M5. A difference between FIGS. 12A and 12B is only the portions of the TSVs (VSSQ) and the TSV (VDDQ).

As understood from FIGS. 11, 12A and 12B, the size of each TSV of the DQ TSV group 22 and the I/O power supply TSV group 21 is larger than the width of each power supply line of the power supply voltage VDDQ or the ground potential VSSQ. Then, in the wiring layers M4 and M5 over the I/O power supply TSV group 21, the respective TSVs (VDDQ) are partially connected in an upper area to the meshed lines of the power supply voltage (VDDQ) through contacts, and the respective TSVs (VDDS) are partially connected in an upper area to the meshed lines of the power supply voltage (VSSQ) through contacts. Further, in the wiring layers M4 and M5, an area between each TSV (DQ) of the DQ TSV group 22 and the upper pad P is not used as a space for the power supply lines. Meanwhile, as described above, since the data bus DB can be formed without using the wiring layer M4, it is possible to obtain an advantage of high-speed operation by reducing wiring load of the data bus DB, and to configure the power supply lines of the wiring layers M4 and M5 with an efficient layout. Further, since the power supply lines can be formed with the same line pitch in the wiring layer M5 in a range from the memory bank region 11 to the I/O power supply TSV group 21, it is possible to simplify manufacturing processes. An example has been described in which the respective TSVs (VDDQ, VSSQ and DQ) are electrically connected to corresponding lines in the wiring layers M4 and M2. This is because that the DQ terminals can be electrically connected with a relatively low impedance to the drivers of the I/O region 14, and that line impedances of the power supply voltage VDDQ and the ground potential VSSQ can be reduced. All the TSVs may be electrically connected to the corresponding lines in an arbitrary single layer for the purpose of simplifying the manufacturing processes.

Figure 13:
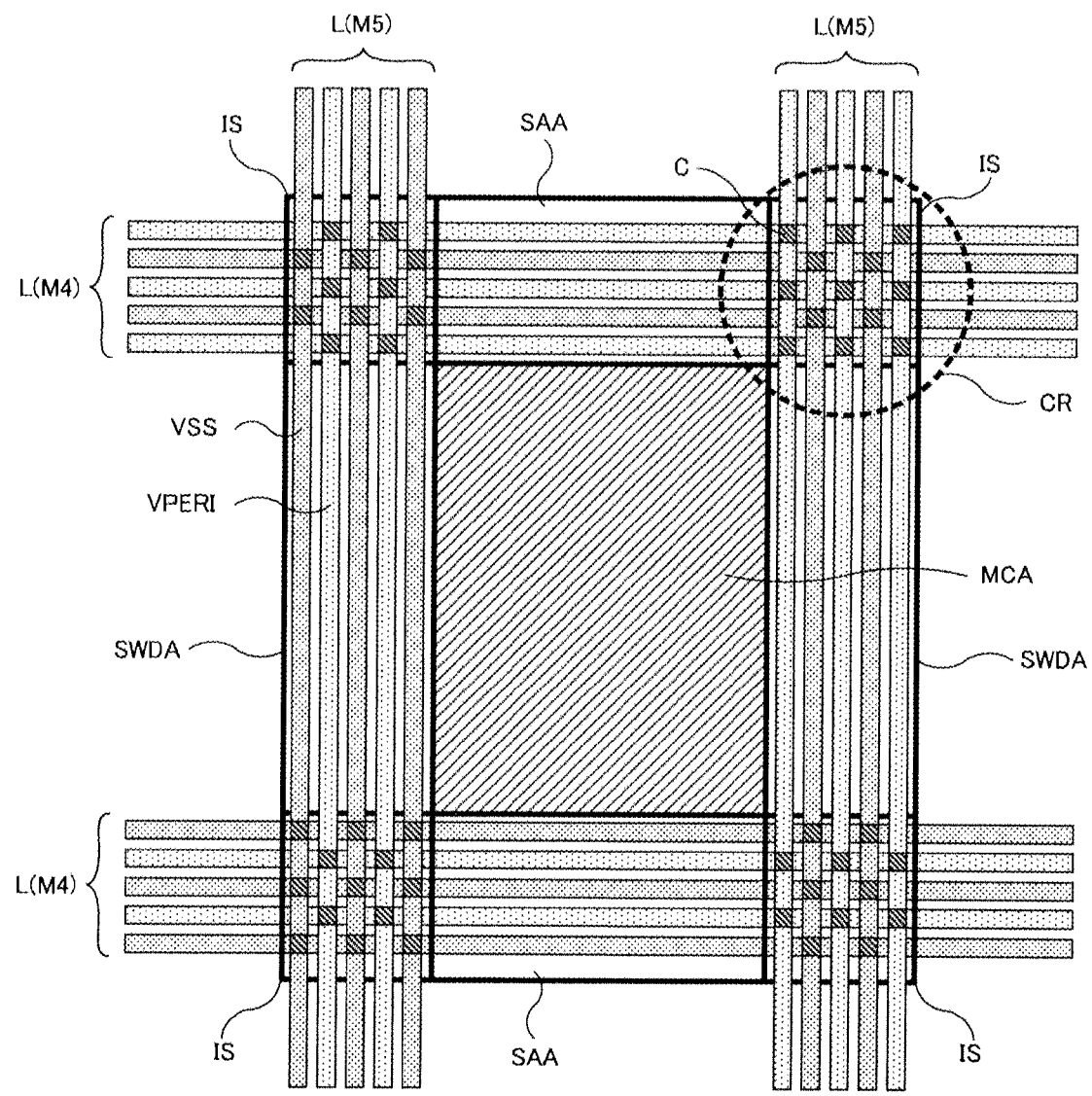
FIG. 13 is a diagram showing a wiring structure of the wiring layers M4 and M5 in an area around a memory cell array MCA in the sub-mat 40 of FIG. 9B.

Next, FIG. 13 shows a wiring structure of the wiring layers M4 and M5 in an area around the memory cell array MCA in the sub-mat 40 of FIG. 9B. The range shown in FIG. 13 corresponds to the range of the planar structure of FIG. 9B. As described previously, the line group L(M5) arranged in upper regions over the sub-word driver arrays SWDA on both sides and in extended regions in the Y direction in the wiring layer M5 includes lines of the peripheral power supplies extending in the Y direction. Further, the line group L(M4) arranged in upper regions over the sense amplifier arrays SAA on both sides and in extended regions in the X direction in the wiring layer M4 includes lines of the peripheral power supplies extending in the X direction. In the respective line groups L(M5) and L(M4), for example, lines of the power supply voltage VPERI and the ground potential VSS are alternately arranged, and no other controls lines are arranged. As described in FIG. 11, the data bus DB is arranged over the memory cell array MCA in the wiring layer M5. Further, in the wiring layer M4, the lines of the memory bank power supplies are arranged over the memory cell array MCA.

In a contact region CR over each intersection portion IS, there are formed a plurality of contacts C that electrically connect between the upper and lower line groups L(M5) and L(M4). Accordingly, by interconnecting the line groups L(M5) and L(M4) via a large number of intersection portions IS (the number of sub-mats 40×four intersection portions IS), it is possible to sufficiently reduce the line impedances of the peripheral power supplies. Although FIG. 13 shows an example in which the line groups L(M5) and L(M4) each having five lines intersect with each other and twelve contacts C are formed in one contact region CR, it is possible to appropriately set the number of lines or the number of contacts C.

Figure 14:
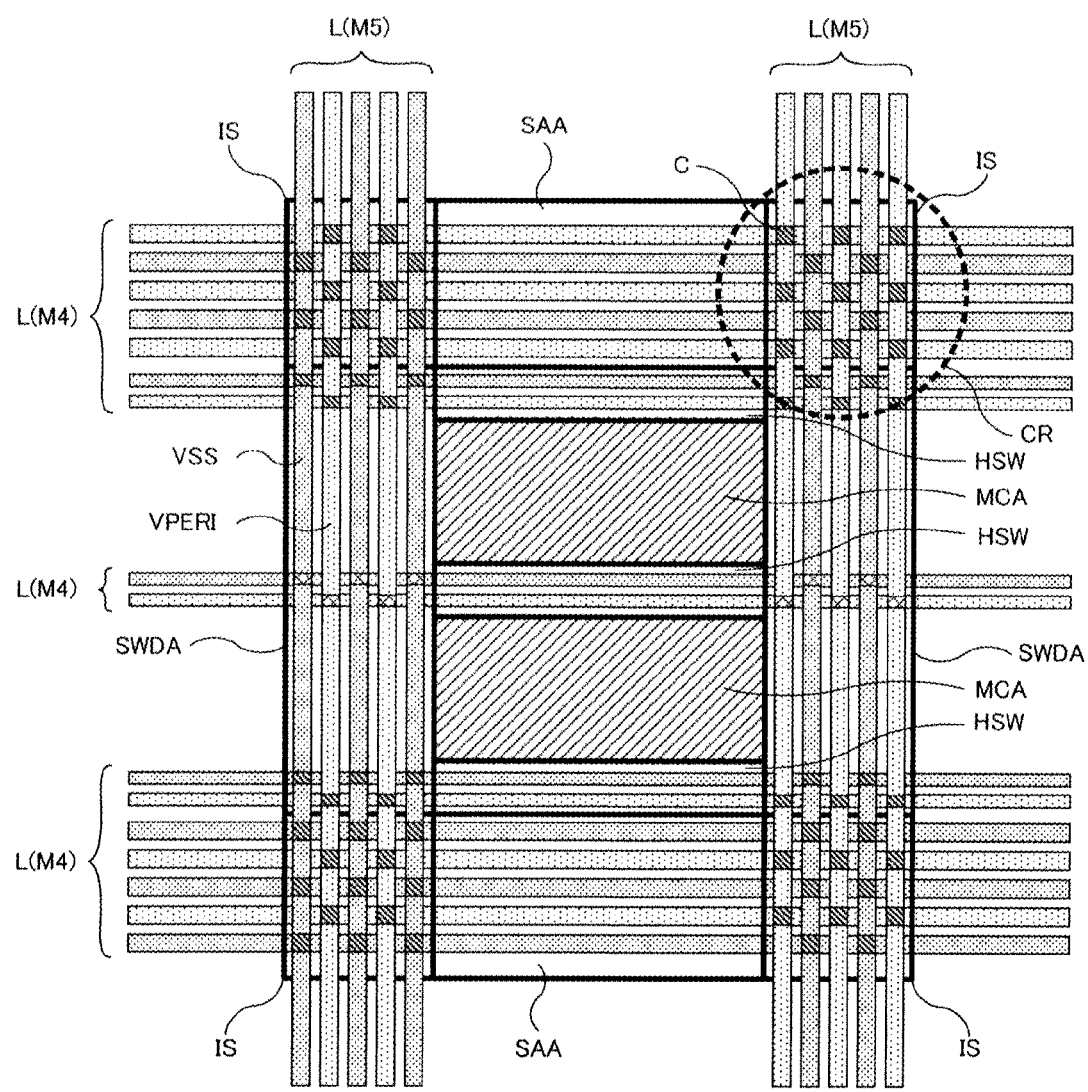
FIG. 14 is a diagram showing a wiring structure of the wiring layers M4 and M5 in the same area as in FIG. 13 in the modification of FIG. 10.

Further, FIG. 14 shows a wiring structure of the same range as in FIG. 13 regarding the modification of FIG. 10. In FIG. 14, a difference from FIG. 13 is that there is arranged a pair of lines of the peripheral power supplies (the power supply voltage VPERI and the ground potential VSS) extending in the X direction in a region in the wiring layer M4 over a plurality of switch portions HSW and the extended regions as described in FIG. 10. Then, the pair of lines is electrically connected to the line group L(M5) through the plurality of contacts C over the sub-word driver arrays SWDA. By this wiring structure, it is possible to further reduce the line impedances of the peripheral power supplies. In FIG. 14, other points are the same as in FIG. 13, so description thereof will be omitted.

As described above, the embodiments of the invention have been specifically described. However the present invention is not limited to the above embodiments and can variously be modified without departing the essentials of the present invention. For example, if the system of FIG. 1 in the embodiments comprises the multi-core DRAM chip C1 and the multi-core CPU chip C0 is not provided or is replaced with the other chip, the invention can be applied to the system. Further, the number of stacked multi-core DRAM chips C1 is not limited to one, and the invention can be applied even if a plurality of multi-core DRAM chips C1 are stacked. Furthermore, the multi-core DRAM chip C1 may be replaced with a memory chip comprising memory cores other than the DRAM core.

The invention claimed is:

1. A semiconductor device comprising:
a first chip including first and second voltage terminals electrically independent of each other and a first data terminal, the first and second voltage terminals being supplied with first and second voltages, respectively; and
a second chip stacked with the first chip, the second chip that includes:
third and fourth voltage terminals electrically coupled to the first and second voltage terminals of the first chip, respectively;
a second data terminal electrically coupled to the first data terminal of the first chip;
a memory circuit including a plurality of memory cells;
a data control circuit coupled to the memory circuit;
a parallel-serial conversion circuit coupled between the second data terminal and the data control circuit, the parallel-serial conversion circuit being configured to receive a plurality of write data supplied in series from the second data terminal and transfer the plurality of write data in parallel to the data control circuit, and receive a plurality of read data in parallel from the memory circuit and transfer the plurality of read data in series to the second data terminal;
the data control circuit being electrically coupled to the third voltage terminal to be supplied with the first voltage and electrically independent of the fourth voltage terminal, and the parallel-serial conversion circuit being electrically coupled to the fourth voltage terminal to be supplied with the second voltage and electrically independent of the third voltage terminal.

2. The semiconductor device as claimed in claim 1, wherein the first chip includes first and second through electrodes each penetrating the first chip, the first through electrode being coupled to the first voltage terminal and the second through electrode being coupled to the second voltage terminal.

3. The semiconductor device as claimed in claim 1, wherein the data control circuit includes a voltage converter converting the first voltage to a third voltage lower than the first voltage and the data control circuit operates on the third voltage.

4. The semiconductor device as claimed in claim 1, wherein the first chip further includes additional first and second voltage terminals electrically independent of each other and an additional first data terminal, the additional first and second voltage terminals being supplied with the first and second voltages, respectively, the second chip further including:
additional third and fourth voltage terminals electrically coupled to the additional first and second voltage terminals of the first chip, respectively;

an additional second data terminal electrically coupled to the additional first data terminal of the first chip;

an additional memory circuit including a plurality of memory cells; an additional data control circuit coupled to the additional memory circuit; and an additional parallel-serial conversion circuit coupled between the additional second data terminal and the additional data control circuit, the additional parallel-serial conversion circuit being configured to receive a plurality of write data supplied in series from the additional second data terminal and transfer the plurality of write data in parallel to the additional data control circuit, and receive a plurality of read data in parallel from the additional memory circuit and transfer the plurality of read data in series to the additional second data terminal;

the additional data control circuit being electrically coupled to the additional third voltage terminal to be supplied with the first voltage and electrically independent of the additional fourth voltage terminal and the additional parallel-serial conversion circuit being electrically coupled to the additional fourth voltage terminal to be supplied with the second voltage and electrically independent of the additional third voltage terminal.

5. The semiconductor device as claimed in claim 1, wherein the first chip includes additional first and second through electrodes each penetrating the first chip, the additional first through electrode being coupled to the additional first voltage terminal and the additional second through electrode being coupled to the additional second voltage terminal.

6. The semiconductor device as claimed in claim 1, wherein the additional data control circuit includes an additional voltage converter converting the first voltage to the third voltage and the additional data control circuit operates on the third voltage.

* * * * *